US006543028B1

(12) United States Patent
Jamil et al.

(10) Patent No.: US 6,543,028 B1
(45) Date of Patent: Apr. 1, 2003

(54) SILENT DATA CORRUPTION PREVENTION DUE TO INSTRUCTION CORRUPTION BY SOFT ERRORS

(75) Inventors: Sujat Jamil, Chandler, AZ (US); Hang T. Nguyen, Tempe, AZ (US); Andres Rabago, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/540,295

(22) Filed: Mar. 31, 2000

(51) Int. Cl.[7] .......................... H03M 13/00; G06F 7/02; H02H 3/05
(52) U.S. Cl. .................. 714/800; 714/52; 714/819
(58) Field of Search ........................ 714/15, 34, 48, 714/49, 52, 799, 800, 807, 819, FOR 288; 712/227; 711/118, 119

(56) References Cited

U.S. PATENT DOCUMENTS 4,604,750 A * 8/1986 Manton et al. ............. 714/764
5,953,351 A * 9/1999 Hicks et al. ................ 714/763
6,044,458 A * 3/2000 Rinkenberger et al. ..... 712/227
6,226,763 B1 * 5/2001 Fu et al. ...................... 714/53
6,412,088 B1 * 6/2002 Patapoutian et al. ........ 714/764
6,457,067 B1 * 9/2002 Byers et al. ................. 710/3
6,457,119 B1 * 9/2002 Boggs et al. ............... 712/227

* cited by examiner

Primary Examiner—Albert Decady
Assistant Examiner—Matthew Dooley
(74) Attorney, Agent, or Firm—Blakely, Sokoloff, Taylor & Zafman LLP

(57) ABSTRACT

A technique to detect and correct corruption of instructions by soft errors. A parity bit is propagated with an instruction through the instruction flow path and checked at selected places. When a parity error is detected, a replay circuit is used to perform a replay to reload the instruction to remove the corrupted instruction.

29 Claims, 5 Drawing Sheets

SILENT DATA CORRUPTION PREVENTION DUE TO INSTRUCTION CORRUPTION BY SOFT ERRORS

BACKGROUND OF THE INVENTION

1. Field of the Invention

The present invention relates to the field of computer systems and more specifically to preventing data corruption due to soft errors.

2. Description of the Related Art

Soft errors in data storage elements, such as memory cells and pipeline latches, occur when incident radiation charges or discharges the storage element, thereby changing its binary state. Soft errors are increasingly a concern with smaller scale fabrication processes as the size (hence, the capacitance) of the storage elements shrink, since incident radiation will have greater effect in causing the soft errors on such smaller scale storage elements. Previously, soft errors were statistically significant only for large and dense storage structures, such as cache memories. However, the smaller feature structures are now more prone to having soft error. Structures, such as pipeline latches (particularly, wide multi-bit datapath latches), are affected to a greater extent by soft errors, where probability of occurrence of such soft errors is much more significant.

A problem with soft errors is that they have a tendency to silently corrupt data in a program. The program continues to execute, since the system is unable to detect the corrupted data, and generates an incorrect result. In some instances the system may not be able to detect the corrupted result. For example, encoding of many instructions differ in only one single bit value. A compare-equal instruction and a compare-not-equal instruction may have be different by one bit value. A probability of for data corruption is much greater in this instance. Accordingly, this type of silent data corruption (SDC) is not desirable in critical applications, such as for commercial transaction server applications, where wrong results can have broad-reaching implications.

In a high frequency, highly-pipelined machine, the pipeline latches are susceptible to such soft errors. For example, instruction data latches make up a significant portion of the total number of latches on a chip that are susceptible to soft errors. These latches, if protected, can significantly reduce the total undetected error count of a high performance processor. Thus, it is desirable to optimize the machine design to reduce, or even prevent, incorrect results due to soft errors. Since it is virtually impossible to stop all soft errors from occurring, at the very minimum it is desirable that soft errors be detected when they occur, so at least the application can be terminated and any data corruption reported. A preferable option is to detect the error when it occurs and seamlessly continue execution of the application after correcting the error.

Past practices have used parity checking and error correcting code techniques to identify the occurrence of soft errors. Past practices have also used a hardware solution, such as functional redundancy, to check for soft errors. However, this later approach typically requires significant additional circuitry on-chip to provide the error detection. None have addressed soft error detection and seamless correction, when such soft errors are detected, to the extent provided by the practice of the present invention.

DETAILED DESCRIPTION OF THE INVENTION

Figure 1:
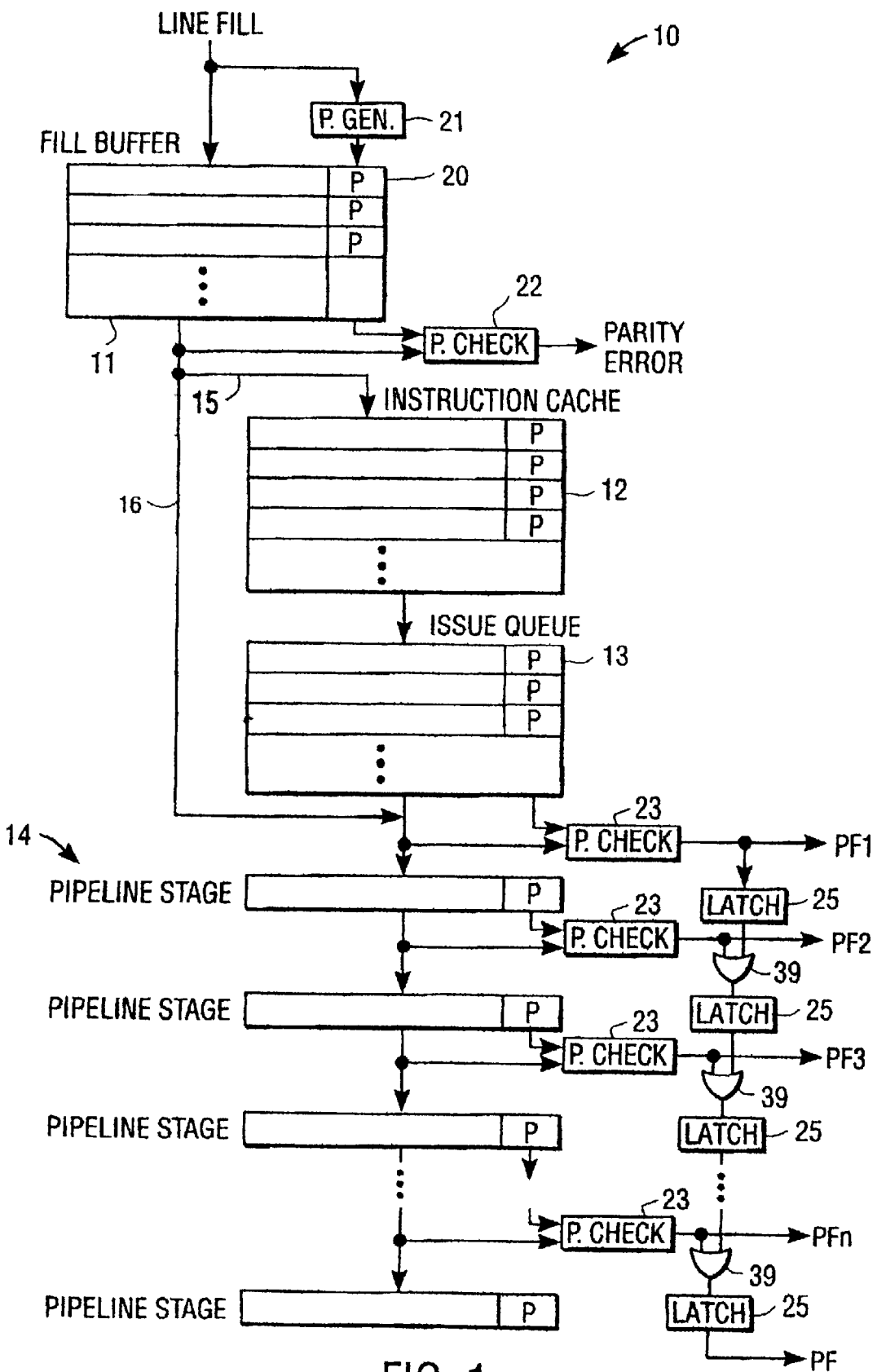
FIG. 1 is a block schematic diagram showing an embodiment of the present invention when parity checking is used along an instruction flow path to detect a soft error occurring on an instruction.

Referring to FIG. 1, a portion of a processor for fetching and issuing processor instructions is shown. An instruction processing apparatus or unit 10 is illustrated according to an instruction flow from fetching of the instruction to its retirement. The instruction processing apparatus is comprised of an instruction line buffer 11, instruction cache memory 12, instruction issue queue 13 and a plurality of pipeline stages 14. In the described embodiment, the processor containing the apparatus 10 is a high performance processor, such as a super-scalar processor, having a variety of on-chip circuitry for receiving, processing and outputting data. The processor includes other circuitry than that shown in FIG. 1 for fetching, issuing, decoding and executing instructions. The general concepts of processing instructions and executing them are known in the art. Accordingly, fill buffers, caches, issue queues and instruction pipeline stages known in the art can be readily adapted for those named units/stages of FIG. 1 and further adapted to practice the present invention.

The instruction cache memory (also simply stated as a "cache") 12 is used to store frequently executed instructions. An instruction fill buffer 11, which may be part of the instruction cache 12, is associated with the caching of instructions. The fill buffer 11 is comprised of latches (or latch equivalents) to allow returned lines from memory or higher level caches to temporarily reside therein prior to being written into the instruction cache 12. Accordingly, an instruction line fill is coupled to the fill buffer 11, so that instructions from another source are returned to fill the buffer 11. As noted, the instructions may be returned from memory (either on-chip or off-chip) or, where multi-level cache structures exist, the instructions may be returned from a higher-level cache (either on-chip or off-chip).

In the particular embodiment, the fill buffer 11, once loaded, can be read in two different ways. The line can be read for writing into the instruction cache 12 (shown by path 15) or it can be read directly into the pipeline (shown by path 16). Generally, for new instructions, the selected line from the buffer 11 is written into the cache 12. In those instances where a line needs to be sent to the pipeline stages 14, path 16 is available.

In the practice of the invention, an instruction line fill to the buffer 11 also includes a parity bit 20 for the line stored in the buffer 11. The parity could be generated remotely and imported from memory or higher level cache, or it can be generated locally, as exemplified by a parity generation circuit 21. A typical method for parity generation is by performing an exclusive-OR (XOR) operation on the bits. The parity bit 20 is stored in the line buffer 11, respectively along with the instruction entry.

On reads from the fill buffer for updating the instruction cache 12, the corresponding parity bit is checked by a parity check circuit 22. This parity check detects if any single bit soft error occurred to the instruction when transitioning through the latches of the line buffer 11. Although possible, the probability of multi-bit soft errors in the buffer latches is statiscally low. If there is a parity check error, a parity error signal from the parity check circuit 22 causes the line not to be written into the cache and the entry is invalidated in the fill buffer.

Figure 2:
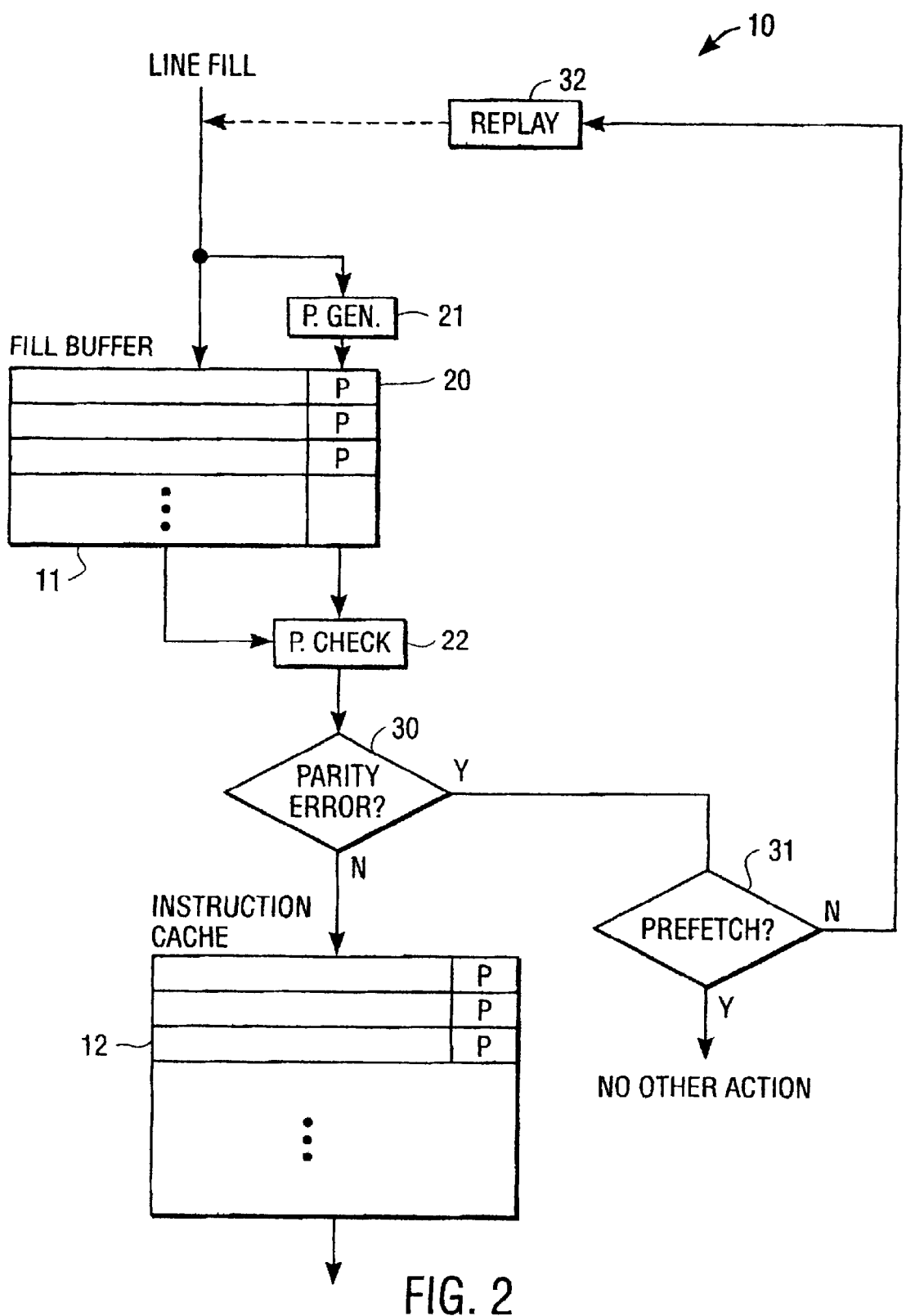
FIG. 2 is a block diagram showing an embodiment of a front-end parity checking performed to detect a soft error.

When a parity error is indicated from the parity check circuit 22, causing an invalidation for the particular entry in the buffer 11, the entry can be rewritten (reloaded) into the buffer 11. However, an alternative embodiment is shown in FIG. 2. In this alternative technique, the manner in which a parity check from the check circuit 22 is handled will depend on the nature of the instruction being checked. A tag in the fill buffer entry will specify whether the particular fill is from an instruction demand-fetch or if the fill is from an instruction prefetch. A demand-fetch is a condition in which the processor is waiting to execute the instruction, but is not present in the instruction cache 12. A prefetch is a condition in which the processor may execute the instruction, but may not, due to the speculative nature of the instruction. A tag in the fill buffer will identify if the instruction is a demand-fetch instruction or if it is a speculative prefetch instruction.

In FIG. 2, a decision flow is shown in which block 30 identifies if a parity error has occurred from the parity check circuit 22. If no error is detected, the process proceeds normally allowing the instruction to be loaded into the cache 12. If an error is detected, then block 31 determines if the instruction entry is a prefetched instruction. If it is a prefetch, canceling the cache line fill and invalidating the fill buffer entry is sufficient to prevent data corruption in the latch from execution. The entry can be reloaded into the fill buffer 11. However, if it was a demand fetch, the processor is still waiting for the instruction to continue execution.

In this embodiment, a front-end replay circuit 32 is used to cause the instruction fetch to recur (replay) to the same instruction pointer address to replay the instruction. By this described technique, not only is the error detected, but the error is effectively corrected by replacing the erroneous instruction with an error-free version. Since many processors already implement instruction prefetch mechanisms (including, instruction replay), these devices can be readily adapted for the practice of the present invention with minimal incremental design overhead. Furthermore, although the replay is shown for use With only demand-fetch entries, the replay can be extended to prefetch entries as well, if desired.

Referring to FIG. 1 again, the parity 20 that is generated or loaded into the fill buffer 11 is stored along with the entry into the instruction cache 12 when the cache fill occurs. Typically, the instruction cache 12 is configured as an array. Then, on reads from the instruction cache 12, the entries are propagated to the instruction issue queue 13. The parity bit is also read along with the instruction into the queue 13.

Subsequently, the instructions are propagated through an instruction pipeline, comprised of pipeline stages 14. The actual number of such stages 14 will depend on the processor and/or the computer system, but generally, a number of stages is present for processing (including the decoding of instructions). It is appreciated that many modern processors have degrees of speculative execution built in them, including, but not limited to, branch misprediction and speculative execution of unsafe operations. These processors will utilize a pipeline structure, as well as a mechanism to flush the pipeline in case of an incorrect speculation and restart from a specific program location.

As shown in FIG. 1, the parity bit is propagated with the instruction for each entry through the queue 13 and to each pipeline stage 14. The present invention incorporates a number of parity check circuits 23 to check for parity at each of the pipeline stages 14. The parity check circuit 23 operates equivalently to the earlier described circuit 22 to determine the parity of the particular line and check that parity to the parity bit for that corresponding line. If a parity check fails, a fault condition (parity error) is signaled.

FIG. 1 shows two ways in which the parity fault can be detected. In one technique, the outputs of each parity check circuit 23 (shown as PF1-PFn) are used separately for fault detection. An embodiment of this first technique is described further below in reference to FIG. 3. In a second technique, a parity check circuit output is OR'ed with next stage parity check circuit output for stages 14. A series of latching circuits (latches or their equivalents) 25 are used to synchronize the parity check outputs through the pipeline. The OR'ing function is exemplified by OR gates 39 in FIG. 1. At the end of the pipeline stages 14, a single parity flag (PF) is generated. An embodiment of this second technique is described further below in reference to FIG. 4.

It is to be noted that in a typical high speed processor, the instruction queue read time is critical and generally does not provide sufficient time to trigger an instruction fetch replay without slowing the frequency of the processor. Typically, the issue queue 13 and the pipeline stages 14 utilize latches for propagating the instructions. The present invention uses the parity check at each of the pipeline stages (commencing at the output of the instruction entry from the issue queue, which is the input to the first stage of the pipeline) 14, to determine if a soft error occurred as the instruction propagates. When a soft error is detected, a fault condition is noted in way of a parity check fault.

Figure 3:
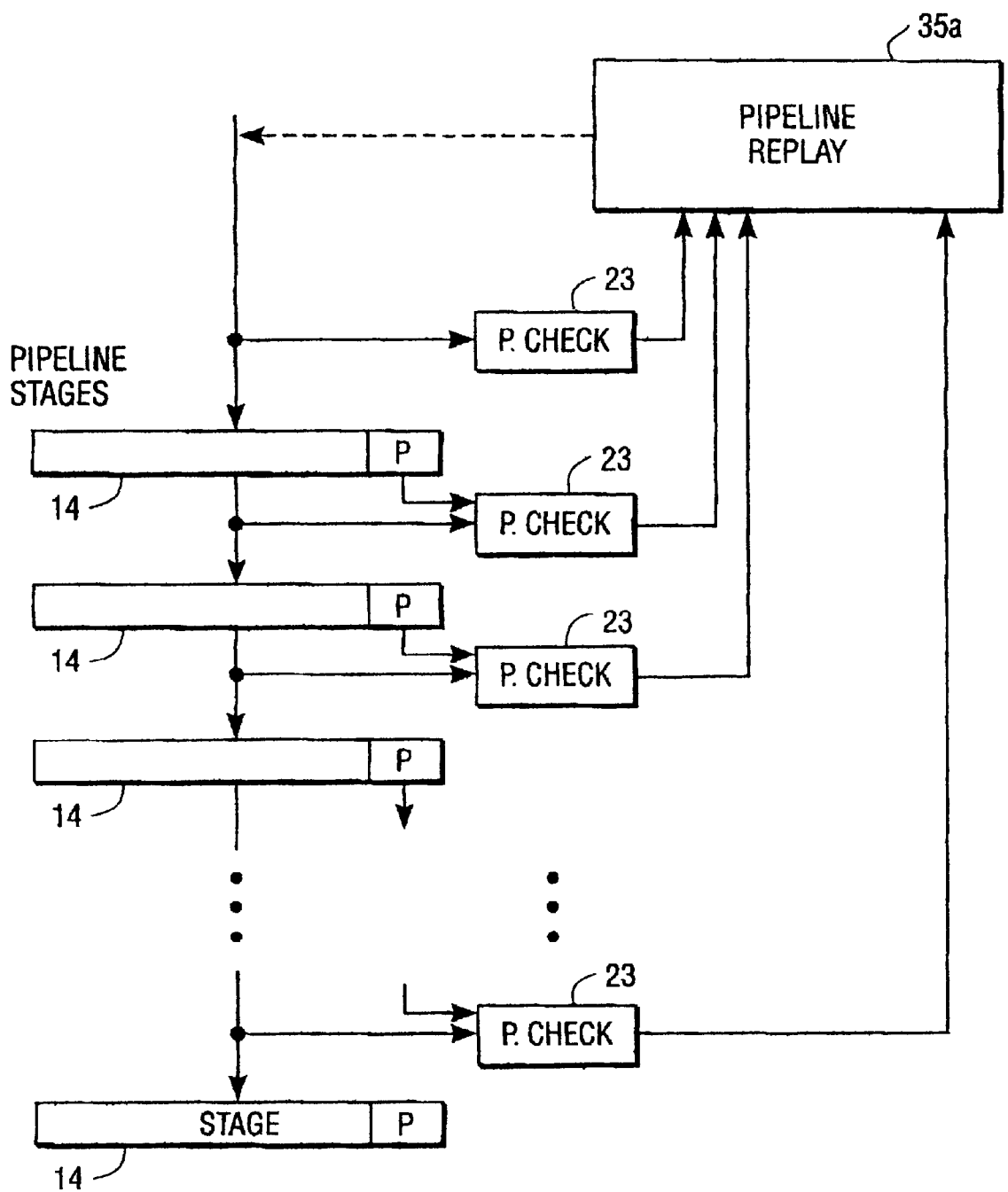
FIG. 3 is a block schematic diagram showing an embodiment of a back-end parity checking performed in pipeline stages to detect a soft error.

Although a variety of techniques can be applied to handle a parity fault from the pipeline, two techniques described above are further illustrated in FIGS. 3 and 4. In FIG. 3, each fault is input to a back-end (pipeline) replay circuit 35a. The replay circuit 35a is capable of identifying in which stage the parity fault occurred and can respond accordingly.

Figure 4:
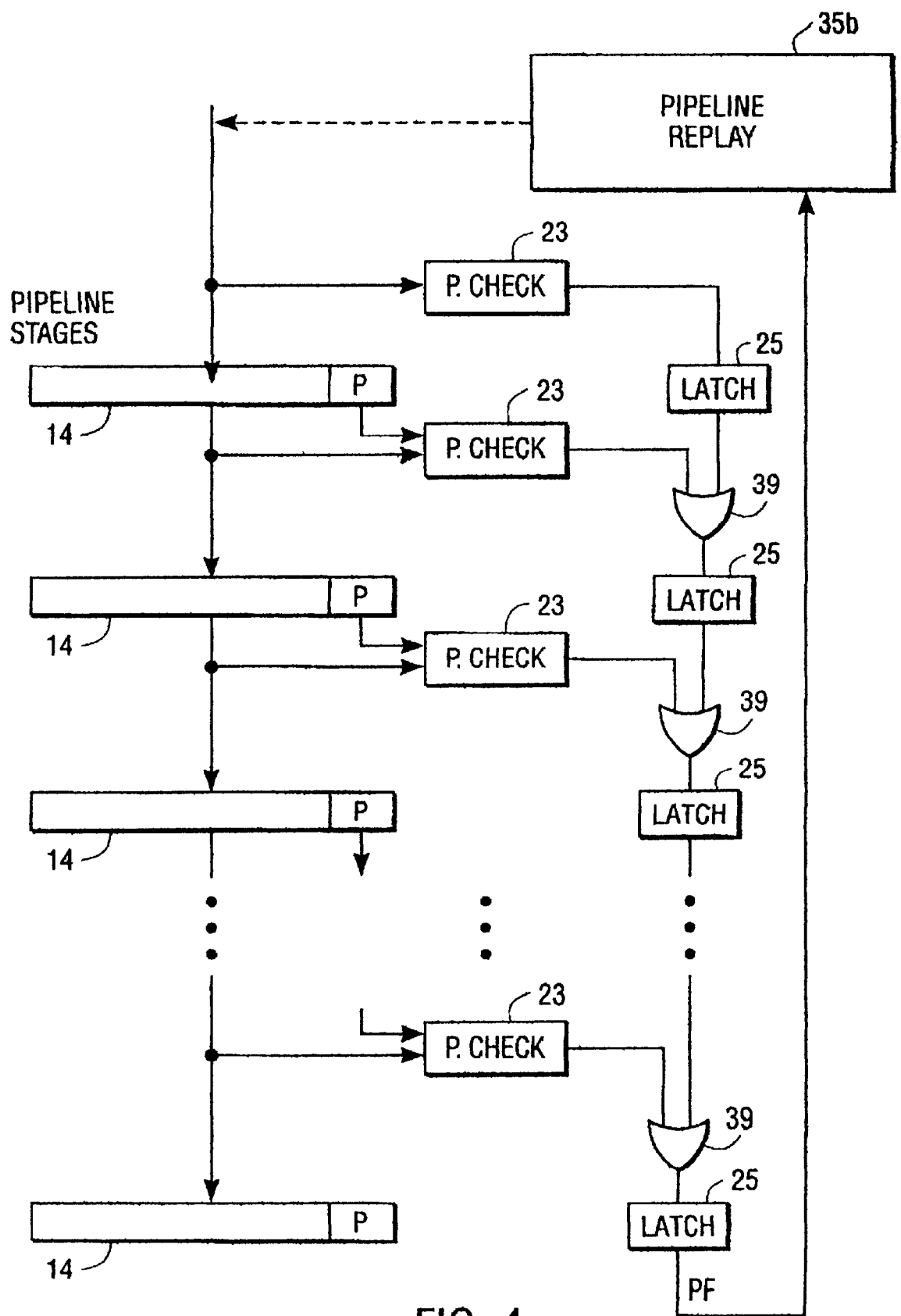
FIG. 4 is a block schematic diagram showing another embodiment of a back-end parity checking performed in pipeline stages to detect a soft error.

In FIG. 4, each of the fault signals is OR'ed (as shown by OR gates 39) with the next stage fault signal to generate a parity flag (PF), so that the flag is also propagated down the stages. As noted above, a series of latches 25 are used for latching the parity check signals through the pipeline. A final flag output is coupled to a back-end replay circuit 35b, so that whenever a parity check fault is detected, the pipeline is flushed and replayed. The error flag can be factored into the flush logic to restore the processor back to the erroneous instruction.

As noted above, many modern processors already include replay mechanisms. These replay mechanisms can be readily adapted to provide the replay when a parity check fault is noted in the pipeline. Accordingly, by monitoring each stage of the instruction pipeline, any soft error which could corrupt an output generated by the instruction can be detected and corrected. Although it is desirable to have a parity check circuit for each stage of the pipeline, not every stage input need to be checked for parity. An embodiment of the invention implements select arbitrary stages for the parity checking, so that only some of the stages 14 are checked.

Figure 5:
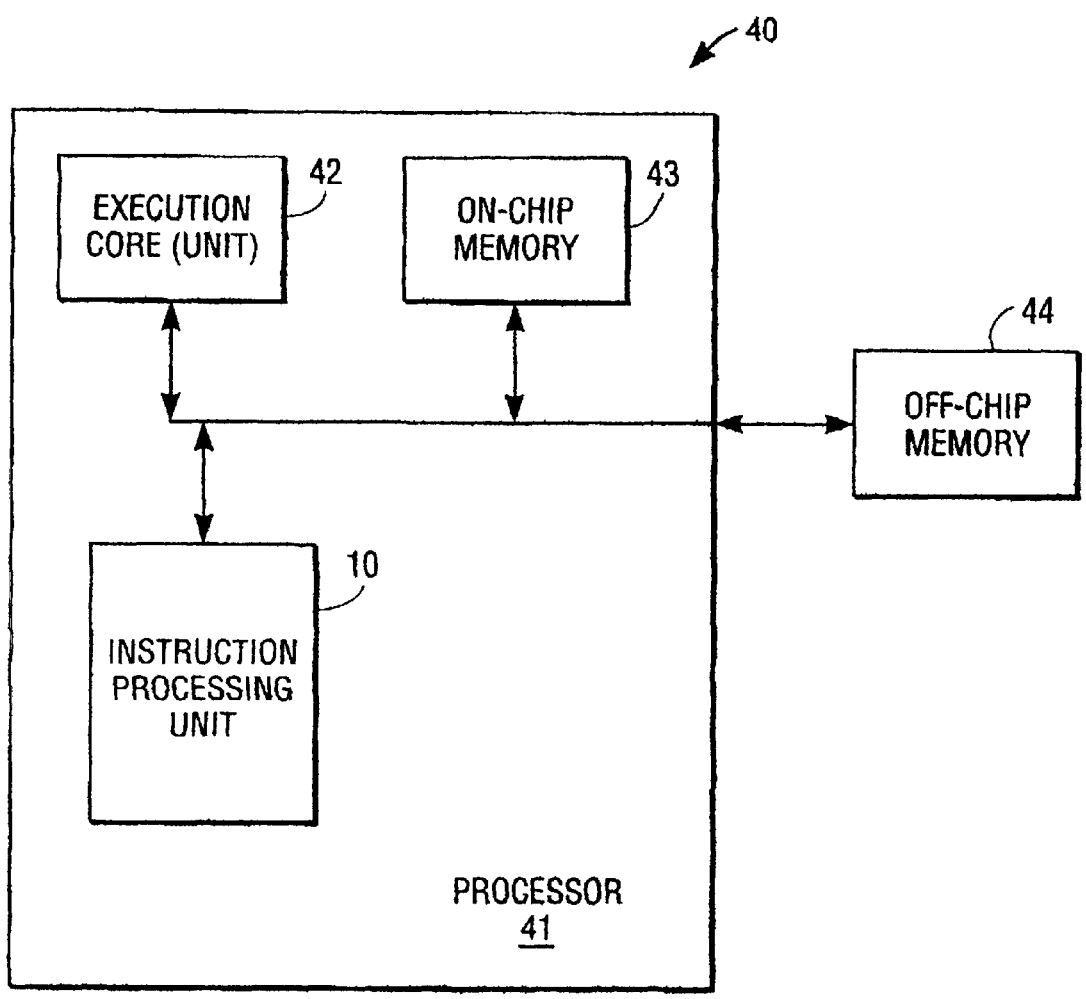
FIG. 5 is a block schematic diagram showing an exemplary computer system which implements the present invention to detect soft errors.

FIG. 5 illustrates one typical system implementation for the invention. A computer 40 is shown in which a processor 41 functions as a sole or one of a plurality of processors comprising the central processing unit (CPU) or units of the computer 40. Typically, the processor 41 is embodied in a single integrated circuit chip. The processor 41 includes an execution (processing) core 42, which has one or more execution units. A section of the processor is dedicated to include the instruction processing apparatus 10. The instruction processing unit 10 is shown coupled to the core 42. In this embodiment, the operating system (OS) and other programs are generally located in a memory.

The invention is practiced according to the description above to execute an instruction in the core 42. The memory can be located on-chip (as shown by on-chip memory 43) or off-chip (as shown by off-chip memory 44). Typically, the on chip memory can be a cache memory or part of the main memory (RAM). The off-chip memory is typically comprised of main memory (as well as off-chip cache, if present) and other memory devices, such as a disk storage medium. However, it is to be noted, that the invention can be configured in other ways to process the instructions for execution by the core 42.

The present invention provides an efficient technique to detect and correct corruption of instructions. The detection mechanism is situated at various levels or stages utilized for instruction processing. Thus, soft error detection is provided at the front-end where instructions are fetched and cached. Soft error detection is also provided at the back-end of the issue stage, which typically incorporates pipeline stages for decoding the instructions. The detection stages can be placed at all or only at some of the unit outputs to detect soft errors.

In the described embodiment, the soft error detection is provided by propagating a parity bit throughout the instruction processing units/stages, checking for parity at the output of those designated units/stages and providing some form of correction when a parity error is noted. Since replay mechanisms are typically present on modern processors, this replay mechanism is adapted to provide a replay where a fault is noted. In the particular embodiment described, a front-end replay and back-end replay circuits are used, however, a single replay circuit can be readily adapted for use to practice the present invention. The front-end replay allows for refetching of the instruction when errors are detected early on in the instruction cycle and if detected later in the pipeline, the back-end replay allows for a flush and prefetch of the pipeline.

An advantage of the replay is that such circuitry is already present in many processors, so additional chip space needed for practicing the invention is minimized. Also, the replay mechanism allows for corrections to be made seamlessly when parity errors are detected.

Furthermore, in the described embodiment, parity is used to detect corrupted instructions. However, other fault detection mechanisms (other than parity) can be employed as well. That is, the parity bit operates as an error detection bit, but other forms of error checking can be used. In that event, the parity check circuits, which checks for parity, would be replaced by other error detection circuits. Additionally, the invention is described in reference to instructions, since latches (which are targets of soft errors) are used considerably in latching instructions.

Thus, a technique for silent data corruption prevention due to instruction corruption by soft errors is described.

We claim:

1. An apparatus comprising:
   a buffer to receive an entry;
   an error detection bit associated with the entry to identify if a bit state change occurred to corrupt the entry, said error detection bit stored in said buffer along with the entry;
   a cache memory coupled to said buffer to receive the entry along with its error detection bit; and
   an error detection circuit coupled to said buffer to test the entry and compare a result of its test to the error detection bit to identify if the entry is corrupted when the entry is coupled out of said buffer.

2. The apparatus of claim 1 further including a replay circuit coupled to said error detection circuit and said buffer to reload the entry into the buffer if the test indicates that the entry in the buffer is corrupted.

3. The apparatus of claim 1 further including a replay circuit coupled to said error detection circuit and said buffer to reload the entry into the buffer if the test indicates that the entry in the buffer is corrupted and the entry is not a speculative entry.

4. The apparatus of claim 1 wherein said error detection bit is a parity bit and said error detection circuit checks a parity of the entry and compares the checked parity to said parity bit.

5. The apparatus of claim 1 wherein the entry is an instruction for a processor.

6. An apparatus comprising:
   a cache memory to store an entry and having an error detection bit stored therein along with the entry to identify if a bit state change occurred corrupting the entry;
   a pipeline, comprised of a plurality of stages, coupled to said cache memory to process the entry; and
   at least one error detection circuit coupled to said pipeline to test the entry as it propagates through said pipeline and compare a result of the test to the error detection bit to identify if the entry is corrupted.

7. The apparatus of claim 6 further including a replay circuit coupled to said error detection circuit to reload the entry into said pipeline if the entry in said buffer is corrupted.

8. The apparatus of claim 6 wherein each stage of the pipeline has its own error detection circuit, said error detection circuits coupled to a replay circuit to reload the entry into said pipeline if an error in the entry is detected as the entry propagates through said pipeline.

9. The apparatus of claim 8 wherein said error detection bit is a parity bit and said error detection circuit checks a parity of the entry and compares the checked parity to said parity bit.

10. The apparatus of claim 9 wherein each error detection circuit output is logically OR'ed to provide a single fault flag bit if any parity error of the entry is detected in said pipeline stages.

11. The apparatus of claim 10 wherein the entry is an instruction for a processor.

12. A processor comprising:
   a buffer to receive an instruction;
   a parity bit associated with the instruction to identify if a bit state change occurred to corrupt the instruction, said parity bit stored in said buffer along with the instruction;
   a cache memory coupled to said buffer to receive the instruction along with its parity bit;
   an error detection circuit coupled to said buffer and said cache memory to test the parity of the instruction and compare a result of its test to the stored parity bit to identify if the instruction is corrupted when the instruction is coupled out of said buffer; and
   a replay circuit coupled to said error detection circuit and said buffer to reload the instruction into the buffer if the instruction in the buffer is corrupted.

13. The processor of claim 12 wherein said replay circuit reloads the instruction only if the instruction is not a prefetched instruction.

14. The processor of claim 12 wherein said replay circuit reloads the instruction only if the instruction is a demand-fetched instruction.

15. A processor comprising:
   a cache memory to store an instruction and having a parity bit stored therein along with the instruction to identify if a bit state change occurred corrupting the instruction;

a pipeline, comprised of a plurality of stages, coupled to said cache memory to process the instruction;

at least one error detection circuit coupled to said pipeline to test a parity of the instruction as it propagates through said pipeline and compare each test to the parity bit propagated through said pipeline with the instruction to identify if the instruction is corrupted; and a replay circuit coupled to said error detection circuit or circuits to reload the instruction into said pipeline if an error in the instruction is detected as the instruction propagates through said pipeline.

16. The processor of claim 15 wherein each stage of said pipeline has its own error detection circuit, said error detection circuits coupled to said replay circuit to reload the instruction into said pipeline if an error in the instruction is detected as the instruction propagates through said pipeline.

17. The processor of claim 16 wherein each error detection circuit output is logically OR'ed to provide a single fault flag bit if any parity error of the instruction is detected in said pipeline stages.

18. A processor comprising:

a buffer to receive an instruction;

a parity bit associated with the instruction to identify if a bit state change occurred to corrupt the instruction, said parity bit stored in said buffer along with the instruction;

a cache memory coupled to said buffer to receive the instruction along with its parity bit;

a first error detection circuit coupled to said buffer and said cache memory to test the parity of the instruction and compare a result of its test to the stored parity bit to identify if the instruction is corrupted; and a first replay circuit coupled to said error detection circuit and said buffer to reload the instruction into the buffer if the instruction in the buffer is corrupted;

an instruction queue coupled to said cache memory for queuing the instruction;

a pipeline, comprised of a plurality of stages, coupled to said instruction queue to process the instruction;

a plurality of second error detection circuits coupled to the stages of said pipeline to test a parity of the instruction as it propagates through the stages of said pipeline and compare each test to the parity bit propagated through said pipeline with the instruction to identify if the instruction is corrupted; and a second replay circuit coupled to said second error detection circuits to reload the instruction into said pipeline if an error in the instruction is detected as the instruction propagates through said pipeline.

19. The processor of claim 18 wherein the second error detection circuit outputs are logically OR'ed to provide a single fault flag bit if any parity error of the instruction is detected in the pipeline stages.

20. The processor of claim 19 wherein said first replay circuit reloads the instruction into said buffer only if the instruction is not a prefetched instruction.

21. A method comprising:

loading an instruction;

loading a parity bit along with the instruction, the parity bit associated with a parity for the instruction;

performing a parity test of the instruction by checking its parity and comparing the checked parity to the parity bit stored along with the instruction when the instruction is to be cached;

caching the instruction only if the checked parity matches the stored parity bit; and using a replay to reload the instruction if the checked parity and the parity bit do not match indicating a corrupted instruction.

22. The method of claim 21 further including the invalidating of the instruction if the checked parity does not match the stored parity bit.

23. The method of claim 22 wherein the instruction is invalidated, but not replayed to reload the instruction if the checked parity does not match the stored parity bit.

24. A method comprising:

caching an instruction and a parity bit associated with the instruction, the parity bit to identify if a bit state change occurred corrupting the instruction;

propagating the instruction through stages of a pipeline to process the instruction;

performing a parity test of the instruction by checking its parity and comparing the checked parity to the parity bit at one or more stages of the pipeline; and using a replay to reload the instruction if the checked parity and the parity bit do not match indicating a corruption in the instruction as it propagates through the pipeline.

25. The method of claim 24 further including performing the parity test at each stage of the pipeline.

26. The method of claim 25 further including the generating of a single fault flag by OR'ing each parity test to indicate a failed parity check in the pipeline.

27. A method comprising:

loading an instruction into a buffer, including a parity bit which is associated with a parity for the instruction;

performing a parity test of the instruction by checking its parity and comparing the checked parity to the parity bit stored along with the instruction when the instruction is to be cached;

caching the instruction only if the checked parity matches the stored parity bit;

using a first replay to reload the instruction if the checked parity and the parity bit do not match indicating a corrupted instruction;

queuing the instruction and the parity bit from the cache;

propagating the queued instruction through stages of a pipeline to process the instruction;

performing a parity test of the instruction by checking its parity and comparing the checked parity to the parity bit at one or more stages of the pipeline; and using a second replay to reload the instruction if the checked parity and the parity bit do not match, indicating a corruption in the instruction as it propagates through the pipeline.

28. The method of claim 27 further including the invalidating of the instruction in the buffer if the checked parity does not match the stored parity bit when caching the instruction.

29. The method of claim 28 further including performing the parity test at each stage of the pipeline.

* * * * *

UNITED STATES PATENT AND TRADEMARK OFFICE
CERTIFICATE OF CORRECTION

PATENT NO. : 6,543,028 B1
DATED : April 1, 2003
INVENTOR(S) : Jamil et al.

It is certified that error appears in the above-identified patent and that said Letters Patent is hereby corrected as shown below:

Column 3,
Line 42, delete "prefetch", insert -- refetch --.
Line 46, delete "With", insert -- with --.

Column 5,
Line 35, delete "prefetch", insert -- refetch --.

Signed and Sealed this

Thirtieth Day of September, 2003

JAMES E. ROGAN
*Director of the United States Patent and Trademark Office*